United States Patent [19]

Prabhu

[11] Patent Number: 5,277,724
[45] Date of Patent: Jan. 11, 1994

[54] METHOD OF MINIMIZING LATERAL SHRINKAGE IN A CO-FIRED, CERAMIC-ON-METAL CIRCUIT BOARD

[75] Inventor: Ashok N. Prabhu, East Windsor, N.J.

[73] Assignee: General Electric Co., Schenectady, N.Y.

[21] Appl. No.: 809,372

[22] Filed: Dec. 18, 1991

[51] Int. Cl.⁵ .................. B32B 18/00; C04B 37/00
[52] U.S. Cl. ......................... 156/89; 156/320; 156/325
[58] Field of Search .................. 156/89, 320, 325; 65/59.1, 43

[56] References Cited

U.S. PATENT DOCUMENTS

| | | | |
|---|---|---|---|
| 4,291,107 | 9/1981 | Barry et al. | 429/104 |
| 4,801,488 | 1/1989 | Smith | 501/32 |
| 4,930,857 | 6/1990 | Acarlar | 357/74 |
| 4,952,531 | 8/1990 | Cherukuri | 501/69 |
| 5,013,360 | 5/1991 | Finkelstein et al. | 501/15 |
| 5,041,695 | 8/1991 | Olenick et al. | 174/52.4 |
| 5,043,222 | 8/1991 | Cherukuri | 428/432 |
| 5,044,074 | 9/1991 | Hadwiger et al. | 29/848 |
| 5,047,371 | 9/1991 | Cherukuri | 501/21 |

Primary Examiner—Jan H. Silbaugh
Assistant Examiner—Christopher A. Fiorilla
Attorney, Agent, or Firm—Joseph S. Tripoli; Dennis H. Irlbeck; Vincent J. Coughlin, Jr.

[57] ABSTRACT

A method of fabricating a multi-layered, co-fired, ceramic-on-metal circuit board utilizes a bonding layer of glass. The glass has a coefficient of thermal expansion not greater than that of the metal base. The glass of the bonding layer has a softening point below that of the glass in the multi-layer ceramic so that the glass of the bonding layer flows and bonds to the metal to minimize the lateral shrinkage of the multi-layered ceramic.

7 Claims, 2 Drawing Sheets

METHOD OF MINIMIZING LATERAL SHRINKAGE IN A CO-FIRED, CERAMIC-ON-METAL CIRCUIT BOARD

As is known in the art, multi-layered, co-fired, ceramic circuit boards are fabricated from a stack of layers of ceramic tape sold under the trademark, GREEN TAPE, manufactured by the E. I. DuPont Company of Wilmington, Del. Such ceramic tape can be used to fabricate a co-fired, ceramic package such as that described in U.S. Pat. No. 5,041,695 issued on Aug. 20, 1991, to J. A. Olenick.

A major drawback of such co-fired, ceramic circuit boards is that a shrinkage in volume is experienced by the ceramic bodies after the firing process. This shrinkage, which occurs in the x and y surface dimensions as well as in the z thickness dimension of the respective layers, results from the release, during firing, of the air distributed between the particles as well as the organic binder material in the green tape. Such shrinkage is quite high, typically 10–15% for low temperature (typically below 1000° C.), co-fired, circuit boards. While one can attempt to compensate for such shrinkage in the x and y surface dimensions by oversizing the area of the green tape layers, it is quite difficult to control shrinkage consistently. For instance, in order that the variation in the x and y dimensions of the multi-layered circuit board, after firing, be maintained within 0.1%, a degree of control that may be as large as one to two parts in one hundred in the amount of shrinkage is required. Because of this, the yield on co-fired, ceramic circuit boards is low. In addition, the low temperature, co-fired, circuit boards suffer from poor thermal conductivity and low flexure strengths associated with the glass ceramic. U.S. patent application Ser. No. 809,371, filed on Dec. 18, 1991, by S. C. Cherukuri et al., and assigned to the assignee of the present application, discloses several glass-ceramic compositions that have been used in fabricating multi-layered, co-fired, ceramic-on-metal circuit boards that have excellent thermal dissipation and shrinkage control characteristics with a mechanically rugged base. The thermal expansion coefficients of the glass-ceramics used in these boards ranges from 85° to 105°$\times 10^{-7}$/° C. over the temperature range from room temperature to 600° C. Varying amounts of higher expansion filler materials are combined with the glass-ceramics to provide glass-ceramic/filler combinations for tapes that are compatible with that of the metal base material. The controlled shrinkage of the resultant ceramic layers is due, primarily, to the novel fabrication method described herein.

SUMMARY OF THE INVENTION

The present invention is directed to a method of fabricating a multi-layered, co-fired, ceramic on a metal base, and, more particularly, to a method utilizing a bonding layer of glass deposited on one major surface of the metal base. The glass of the bonding layer has a coefficient of thermal expansion not greater than that of the metal base. A multi-layered ceramic is provided on the bonding layer. The base, the glass of the bonding layer and the multi-layered ceramic are heated to a temperature sufficient to securely attach the ceramic to the base.

DETAILED DESCRIPTION OF THE PREFERRED EMBODIMENTS

Figure 1:
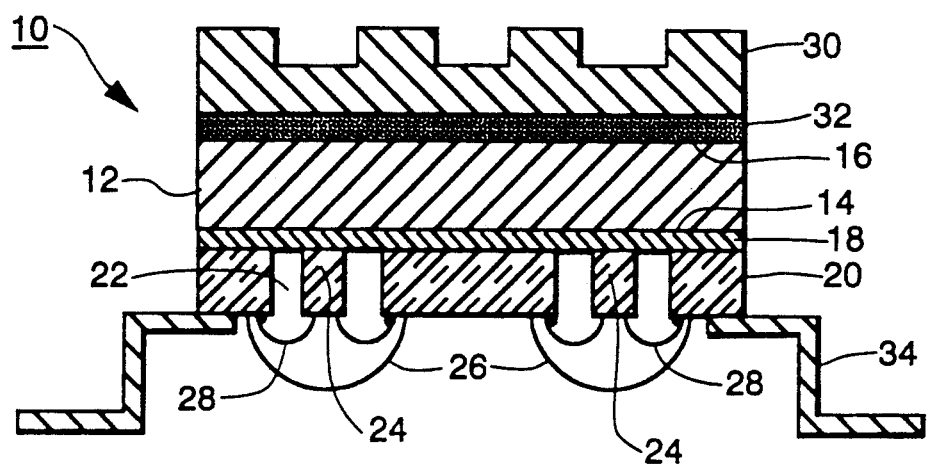
FIG. 1 diagrammatically illustrates an example of a microelectronics package fabricated in accordance with the present invention.

The fabrication process generally comprises forming a metal base 12 having two oppositely disposed major surfaces 14 and 16, for example by stamping a metal core (not shown) and then annealing the core at a temperature of about 500° to 900° C. to provide dimensional stability. The surfaces of the core are cleaned to remove dirt and oxide. Preferably, at least one of the major surfaces 14 and 16 is plated with a suitable material to a thickness of about 0.5 to 25.0 microns. Suitable materials for the base 12 include Cu, Al, Ni, stainless steel, low carbon steel, Cu/Invar/Cu, Cu/Mo/Cu or Cu/stainless steel/Cu, the latter being preferred.

A glass bonding layer 18, of a glass having a coefficient of thermal expansion less than that of the base 12, is applied, as a slurry, to one major surface, for example surface 14, of the base 12. The slurry can be applied by screen printing, spraying, spin coating, curtain coating, fluidized-bed coating, electrophoretic deposition or other equivalent methods. Circuit boards made according to the present invention utilized screen printing and spraying methods. A multi-layered ceramic 20 is provided on the glass bonding layer 18. The multi-layered ceramic is formed from novel glass-ceramic/filler tapes described in the above-referenced, co-pending patent application, filed concurrently herewith and incorporated by reference herein for disclosure purposes.

The multi-layered ceramic 20 may be formed by applying multiple layers of green tape to the glass bonding layer, or the laminated ceramic structure may be bisque fired prior to being placed on the glass bonding layer 18. The resultant structure is co-fired in nitrogen (about 10,000 ppm $O_2$) at a peak temperature of about 900°–930° C. for about 2 to 20 minutes to bond the ceramic 20 to the surface 14 of the base 12. The intermediate glass bonding layer 18 serves two functions; it provides a means of attaching the multi-layered ceramic 20 to the base 12, and it minimizes the shrinkage of the ceramic 20 in the x and y dimensions during the firing. The glass bonding layer 18, in addition to having a coefficient of expansion less than that of the metal base 12, must be sufficiently reactive with the copper plating and the copper oxides on the surface 14 of the base 12 to promote and maintain adhesion between the ceramic 20 and the base during the co-firing operation. The glass of the bonding layer 18 must have a relatively low softening point (<600° C.) so that it can flow and bond to the surface 14 of the metal base 12, and possess appropriate surface tension characteristics at temperatures below the softening point of the glass in the ceramic layer 20 to minimize the lateral (x and y) shrinkage of the ceramic. Additionally, the glass of the bonding layer 18 also must possess good chemical durability and dielectric properties.

The composition of the glass bonding layer 18 is influenced by the composition of the metal core and its thermal characteristics, as well as the composition of the ceramic laminate and the sintering characteristics and the process employed for fabricating the co-fired, ceramic-on-metal circuit board. Each layer of the multi-layered ceramic 20 comprises a glass-ceramic/filler composition having a coefficient of thermal expansion that closely matches that of the base 12 and the glass bonding layer 18, over the temperature range from room temperature to about 600° C. The composition of suitable glass-ceramics are listed in the above-referenced patent application of Cherukuri et al. That application also describes suitable filler materials which are added to the glass-ceramics to tailor their electrical and thermal expansion properties. For the ceramic compositions mentioned in the above-referenced patent application to Cherukuri et al., a number of glass compositions from the multi-component system $PbO-ZnO-BaO-B_2O_3-SiO_2$ are suitable for the glass bonding layer 18. These glass compositions may also contain small amounts of $ZrO_2$ and $Al_2O_3$. Some of the generalized compositions and their typical properties are listed in the Table.

TABLE

| Glass System | Thermal Coefficient of Exp. $(10^{-7})/°C$ | Softening Point (°C.) |
|---|---|---|
| Pb-borate | 75–120 | 280–430 |
| Pb—Zn-borate | 70–110 | 320–450 |
| Pb-borosilicate | 40–120 | 370–700 |
| Pb—Zn-borosilicate | 75–80 | 370–700 |
| Pb—Zn—Ba-borolsilicate | 75–100 | 380–400 |
| Pb-alumino silicate | 60–85 | 440–485 |
| Pb-alumino borosilicate | 80–90 | 390–440 |

Ceramic-on-metal circuit boards have been made according to the present invention using glasses selected from the Pb-Zn-borosilicate and Pb-Zn-Ba-borosilicate glass systems listed in the TABLE. The preferred glass, from the Pb-Zn-Ba-borosilicate system, is a commercially available glass identified as SCC-11, available from SEM-CON Co. (Toledo, Ohio). Another suitable glass from this same system is commercially available as CV-808 from Owens Ill., (Toledo, Ohio). This latter glass contains a small amount of $ZrO_2$. A suitable glass from the Pb-Zn-borosilicate system is CV-101, also commercially available from Owens Ill.

These bonding glasses have been successful in providing good adhesion of the laminated ceramic to a Cu/stainless steel/Cu base 12. In addition, the x-y shrinkage of the laminated ceramic layer 20 is decreased by more than an order of magnitude, to about 0.8% by using these glasses. The x-y shrinkage of the ceramic laminate is typically 12–15% in the absence of the glass bonding layer 18.

Figure 2:
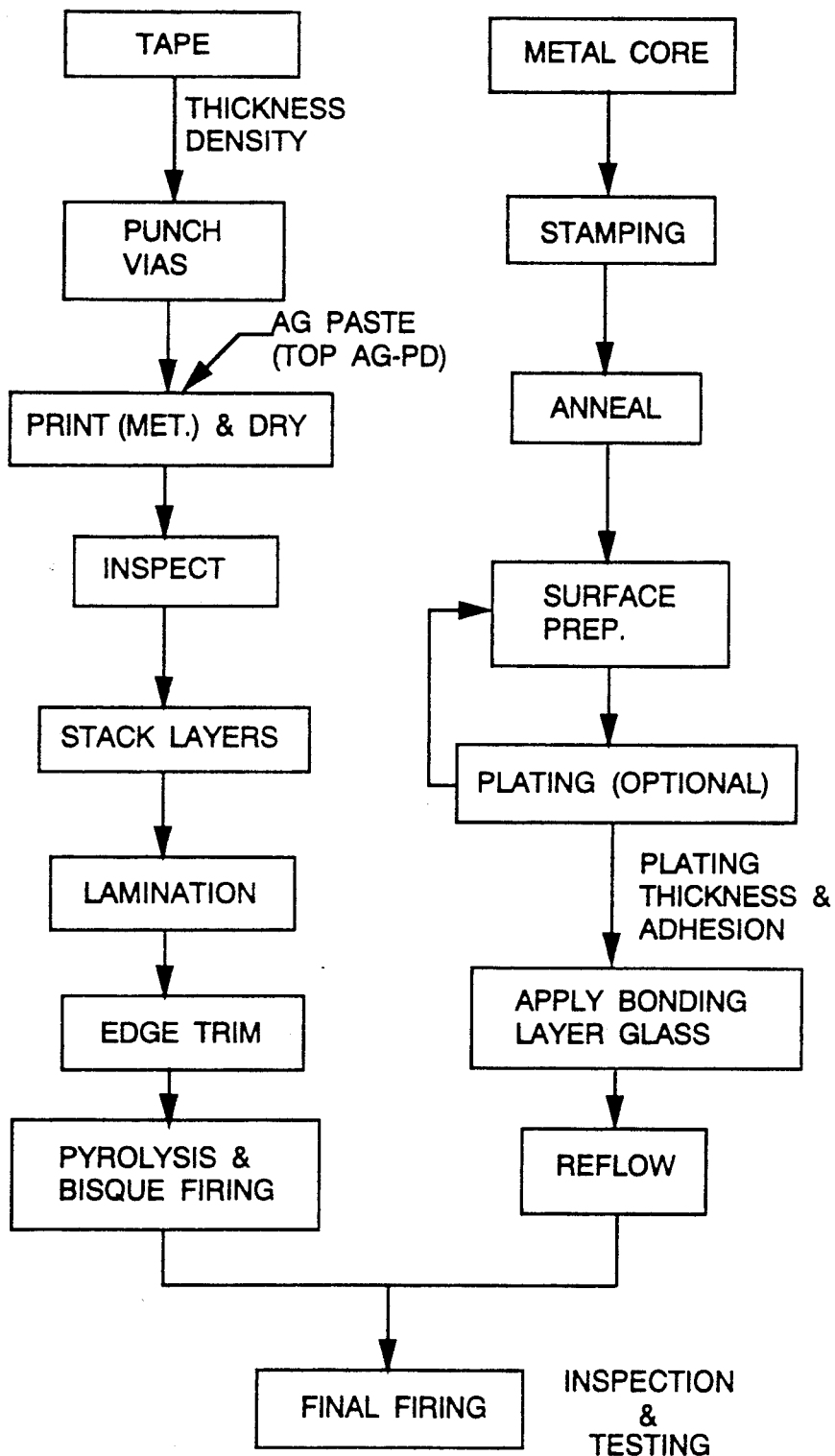
FIG. 2 is a flow chart of the process steps involved in the present invention.

The novel process shown in FIG. 2, involves applying the glass bonding layer by, for example, spray coating, to one major surface, for example surface 14, of the base 12. A layer of SCC-11 glass that had been made into a slurry, by mixing it with about 60 to 90 volume % of a suitable solvent, such as 2-propanol, acetone, ethanol or terpinol, 2-propanol being preferred, is used. The laminated ceramic layer 20 may be formed separately by stacking multi-layers of selectively metalized glass-ceramic/filler tape having vias formed therein, and bisque firing the laminated structure to remove the organics therefrom to form a monolithic ceramic. Alternatively, the ceramic layer 20 may be formed by applying multiple layers of metaled and via punched glass-ceramic/filler tape to the glass bonding layer 18. In the preferred method, the glass bonding layer 18 is heated to a temperature of about 450° C. to pre-flow the glass of the bonding layer to form a thin glass cover having a thickness of about 0.025 mm (0.001 inch) on the surface 14. Then, the previously formed ceramic layer 20 is positioned on the glass bonding layer 18 and the entire structure is co-fired in nitrogen (about 10,000 ppm $O_2$) at a temperature of 900°–930° C. for about 2 to 20 minutes. The peak firing temperatures selected for co-firing depend upon the metal of the base 12 and the composition of the ceramic layer 20. The adhesion of the ceramic layer 20 to the base 12, resulting from the utilization of the glass bonding layer 18, significantly minimizes the x-y shrinkage of the ceramic layer during co-firing, and the shrinkage in volume of the ceramic is mostly confined to the z thickness dimension.

An example of microelectronic packaging of a multi-chip module is shown in FIG. 1. The co-fired ceramic-on-metal structure 10 comprises the metal base 12 having first and second major surfaces 14 and 16 with the co-fired, multi-layered ceramic 20 bonded to the first major surface 14 by the glass bonding layer 18. Each layer of the laminated glass-ceramic/filler tape, prior to firing, may be provided with suitable holes or vias, which, after firing, provide slots 22 in the co-fired, multi-layered, ceramic 20, thereby permitting integrated-circuit chips 24 (or other components) to be attached directly to the metal base 12. An encapsulant 26, covering each of the chips 24, may then be hermetically sealed to the metal base 12. The chips 24 are electrically attached, e.g., by wire bonding 28 or similar means, as is known in the art. Alternatively, each of the chips 24 may be protected by a non-hermetic sealed encapsulant 26.

A heat sink 30 is attached to the opposite major surface 16 of the base 12 by an adhesive 32. Further, the microelectronic packaging includes support structure 34 for mounting the multichip module in a device (not shown).

Although not shown in FIG. 1, co-fired, multi-layered ceramic 20 incorporates metallic conductors which currently comprise Ag and Ag/Pd. However, metallic conductors comprising Cu or Au should also be compatible with co-fired, multi-layered, ceramic-on-metal boards of the type disclosed herein.

What is claimed is:

1. A method of making a co-fired, ceramic-on-metal circuit board comprising a multi-layered ceramic-on-metal base, said metal base having oppositely disposed major surfaces, said method including the steps of depositing a bonding layer of glass on one of said major surfaces of said metal base, said glass bonding layer having a coefficient of thermal expansion not greater than that of said base, providing a bisque fired or green multi-layered ceramic on said glass bonding layer wherein each layer of said multi-layered ceramic comprises a glass ceramic/filter composition, and co-firing said base, said glass bonding layer and said multi-layered ceramic to a temperature sufficient to achieve densification of said multi-layered ceramic and securely attach said multi-layered ceramic to said base, whereby the glass of said bonding layer flows and bonds to said multi-layered ceramic, thereby minimizing the lateral shrinkage thereof.

2. The method as described in claim 1, wherein the glass of said bonding layer is heated to a temperature of about 450° C., to pre-flow the glass of the bonding layer, prior to providing said multi-layered ceramic thereon.

3. The method as described in claim 1, wherein said co-firing step is carried out at a temperature of about 900° C.

4. The method as described in claim 3, wherein said co-firing step is carried out in a nitrogen atmosphere.

5. A method of minimizing lateral shrinkage in a co-fired, ceramic-on-metal circuit board comprising a multi-layered ceramic on a metal base, said metal base having oppositely disposed major surfaces, said method including the steps of depositing a bonding layer of glass on one of said major surfaces of said metal base, the glass of said bonding layer having a coefficient of thermal expansion not greater than that of said base, providing a bisque fired or green multi-layered ceramic on said bonding layer, each layer of said multi-layered ceramic comprising a glass-ceramic/filler composition having a coefficient of thermal expansion that closely matches that of said base and the glass of said bonding layer over a temperature range from room temperature to about 600° C., and co-firing said base, said bonding layer and said multi-layered ceramic to an elevated temperature sufficient to securely attach said multi-layered ceramic to said base, the glass of said bonding layer having a softening point below that of said multi-layered ceramic so that the glass of said bonding layer flows and bonds to the metal base while minimizing the lateral shrinkage of said multi-layered ceramic.

6. The method as described in claim 5, wherein the glass of said bonding layer is heated to a temperature of about 450° C. to pre-flow said glass of said bonding layer, prior to providing said multi-layered ceramic thereon.

7. The method as described in claim 5, wherein said co-firing step is carried out at a temperature of about 900° to 930° C. for about 2 to 20 minutes, in a nitrogen atmosphere.

* * * * *